United States Patent [19]
Thompson et al.

[11] Patent Number: 5,861,219
[45] Date of Patent: Jan. 19, 1999

[54] ORGANIC LIGHT EMITTING DEVICES CONTAINING A METAL COMPLEX OF 5-HYDROXY-QUINOXALINE AS A HOST MATERIAL

[75] Inventors: Mark E. Thompson, Anaheim Hills, Calif.; Stephen R. Forrest; Paul E. Burrows, both of Princeton, N.J.; Yujian You; Andrei Shoustikov, both of Los Angeles, Calif.

[73] Assignees: The Trustees of Princeton University, Princeton, N.J.; The University of Southern California, Los Angeles, Calif.

[21] Appl. No.: 838,099

[22] Filed: Apr. 15, 1997

[51] Int. Cl.$^6$ ................................................. H05B 33/00
[52] U.S. Cl. ...................... 428/690; 428/691; 428/917; 313/504
[58] Field of Search ................................ 428/690, 691, 428/917; 313/504

[56] References Cited

U.S. PATENT DOCUMENTS 4,950,950  8/1990  Perry et al. ............................... 313/504

FOREIGN PATENT DOCUMENTS

WO 96/19792  6/1996  WIPO .

OTHER PUBLICATIONS

Coord. Chem. Rev. (1998), 171, 161–174 May 1998.
Synth. Met. (1997), 91 (1–3), 217–221 May 1997.
Gatterer, A., "Spectrochimica ACTA," vol. 8, '956, pp. 1–8. Pergamon Press Ltd., London.

S. K. Freeman, P. E. Spoerri, Journal of Organic Chemistry, vol. 16, 1951, pp. 438–442.

Forrest, S. et al., "Organic emitters promise a new generation of displays," Laser Focus World, Feb. 1995, pp. 99–107.

You, Y. et al., New Orange and Red Organic Light–Emitting Devices (OLEDS) Using Aluminum Tris(5–Hydroxyquinoxaline), 213TH ACS National Meeting, San Francisco, CA, Apr. 13–17, 1997, Poster Session Paper No. 619, Apr. 15, 1997, (Abstract).

*Primary Examiner*—Charles Nold
*Attorney, Agent, or Firm*—Kenyon & Kenyon

[57] ABSTRACT

The present invention is directed to organic light emitting devices comprised of an electroluminescent layer containing a host material comprised of a metal complex of (5-hydroxy) quinoxaline:

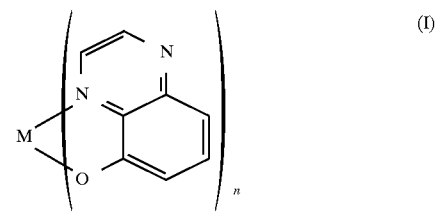

(I)

wherein M is Al, Ga, In, Zn or Mg, with n=3, if M is Al, Ga or In and n=2, if M is Zn or Mg, and to a method for fabricating such devices. Further disclosed for use in the electroluminescent layer of organic light emitting devices are dopant materials comprised of a bisphenyl-squarilium compound, an indigo dye compound or a fullerene compound.

39 Claims, 8 Drawing Sheets

- ■ — Gax₃ [galliumtris(5-hydroxyquinoxaline)]
- ○ — Alx₃ [galliumtris(5-hydroxyquinoxaline)]

ORGANIC LIGHT EMITTING DEVICES CONTAINING A METAL COMPLEX OF 5-HYDROXY-QUINOXALINE AS A HOST MATERIAL

GOVERNMENT RIGHTS

This invention was made with Government support under Contract No. F33615-94-1-1414 awarded by DARPA. The government has certain rights in this invention.

FIELD OF THE INVENTION

The present invention is directed to organic light emitting devices comprised of an electroluminescent layer containing a host material comprised of a metal complex of (5-hydroxy) quinoxaline.

BACKGROUND OF THE INVENTION

Organic light emitting devices (OLEDs) are light emitting devices that are comprised of several layers, in which one of the layers is comprised of an organic material that can be made to electroluminesce by applying a voltage across the device. Certain OLEDs have been shown to have sufficient brightness, range of color and operating lifetimes for use as a practical alternative technology to LCD-based full color flat-panel displays (S. R. Forrest, P. E. Burrows and M. E. Thompson, Laser Focus World, February 1995). Furthermore, since many of the organic thin films used in such devices are transparent in the visible spectral region, they allow for the realization of a completely new type of display pixel in which the red (R), green (G), and blue (B) emission layers are placed in a vertically stacked geometry to provide a simple fabrication process, a small R-G-B pixel size, and a large fill factor.

A transparent OLED (TOLED) which represents a significant step toward realizing high resolution, independently addressable stacked R-G-B pixels has been reported in International Patent Application No. PCT/US95/15790. This TOLED had greater than 71% transparency when turned off and emitted light from both top and bottom device surfaces with high efficiency (approaching 1% quantum efficiency) when the device was turned on. The TOLED used transparent indium tin oxide (ITO) as the hole-injecting electrode and a Mg-Ag-ITO layer for electron-injection. A device was disclosed in which the Mg-Ag-ITO electrode was used as a hole-injecting contact for a second, different color-emitting OLED stacked on top of the TOLED. Each device in the stacked OLED (SOLED) was independently addressable and emitted its own characteristic color through the transparent organic layers, the transparent contacts and the glass substrate, allowing the device to emit any combination of color that could be produced by varying the relative output of the red and blue color-emitting layers.

Thus, publication of PCT/US95/15790 provided the disclosure of an integrated OLED where both intensity and color could be independently varied and controlled with external power supplies in a color tunable display device. As such, PCT/US95/15790 illustrates a principle for achieving integrated, full color pixels that provide high image resolution, which is made possible by the compact pixel size. Furthermore, relatively low cost fabrication techniques, as compared with prior art methods, may be utilized for making such devices.

Devices whose structure is based upon the use of layers of organic optoelectronic materials generally rely on a common mechanism leading to optical emission. Typically, this mechanism is based upon the radiative recombination of a trapped charge. Specifically, devices constructed along the lines discussed above comprise at least two thin organic layers separating the anode and cathode of the device. The material of one of these layers is specifically chosen based on the material's ability to transport holes (the "hole transporting layer"); the other, according to its ability to transport electrons (the "electron transporting layer"). The electron transporting layer typically comprises the electroluminescent layer. With such a construction, the device can be viewed as a diode with a forward bias when the potential applied to the anode is higher than the potential applied to the cathode. Under these bias conditions, the anode injects holes (positive charge carriers) into the hole transporting layer, while the cathode injects electrons into the electron transporting layer. The portion of the luminescent medium adjacent to the anode thus forms a hole injecting and transporting zone while the portion of the luminescent medium adjacent to the cathode forms an electron injecting and transporting zone. The injected holes and electrons each migrate toward the oppositely charged electrode. When an electron and hole localize on the same molecule, a Frenkel exciton is formed. Recombination of this short-lived state may be visualized as an electron dropping from its conduction potential to a valence band, with relaxation occurring, under certain conditions, preferentially via a photoemissive mechanism. Under this view of the mechanism of operation of typical thin-layer organic devices, the electroluminescent layer comprises a luminescence zone receiving mobile charge carriers (electrons and holes) from each electrode.

It would be desirable if each of the color-emitting OLEDs that are used in a SOLED could have the electroluminescent emission efficiently produced in a relatively narrow band centered near selected spectral regions, which correspond to one of the three primary colors, red, green and blue. The materials that are responsible for producing the electroluminescent emission are frequently incorporated into the OLED such that they also serve as the electron transporting layer of the OLED. Such devices are referred to as having a single heterostructure. Alternatively, the electroluminescent material may be present in a separate emissive layer between the hole transporting layer and the electron transporting layer in what is referred to as a double heterostructure.

In addition to having the emissive material present as the primary material in the electron transporting layer, the emissive material may also be present as a dopant that is contained within a host material. Materials that are present as host and dopant are selected so as to have a high level of energy transfer between the host and dopant materials. In addition, these materials need to be capable of producing acceptable electrical properties for the OLED. Furthermore, such host and dopant materials are preferably capable of being incorporated into the OLED using starting materials that can be readily incorporated into the OLED using convenient fabrication techniques.

SUMMARY OF THE INVENTION

The present invention is directed toward host and dopant materials that may be used in the electroluminescent layer of an OLED.

More specifically, the present invention is directed to host materials that may be used to contain dopants selected to produce electroluminescence in a relatively narrow band centered near the saturation wavelength of one of the primary colors.

Still more specifically, the present invention is directed to host and dopant materials that can be used to fabricate OLEDs that produce predominantly red electroluminescence.

One of the features of the present invention is that the color-emitting OLEDs may be especially effective for use in high resolution, independently addressable stacked R-G-B pixels that are incorporated into color tunable display devices.

Yet more specifically, the present invention is directed to a host material in the electroluminescent layer of an OLED which is comprised of a metal complex of 5-hydroxy-quinoxaline of formula I:

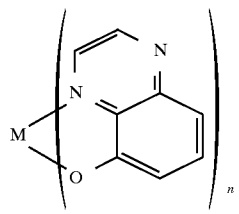

(I)

wherein M is Al, Ga, In, Zn or Mg, with n=3, if M is Al, Ga or In and n=2, if M is Zn or Mg.

Yet more specifically, the present invention is directed to a host material comprised of an aluminumtris(5-hydroxyquinoxaline) having the chemical structure of formula II:

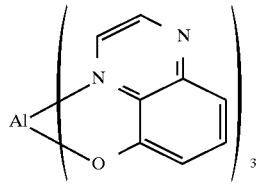

(II)

In addition, one of the embodiments of the present invention is directed to the inner salts of fluorescent dyes that may be used as the dopant material in the electroluminescent layer of an OLED.

More specifically, one of the embodiments of the present invention is directed to inner salts of bisphenyl-squarilium dyes that may be used as the dopant material in the electroluminescent layer of an OLED.

Still another of the embodiments of the present invention is directed to indigo dye compounds that may be used as the dopant material in the electroluminescent layer of an OLED.

Yet another of the embodiments of the present invention is directed to fullerene compounds, for example, $C_{60}$, as the dopant material in the electroluminescent layer of an OLED.

DETAILED DESCRIPTION OF PREFERRED EMBODIMENTS

The present invention will now be described in detail for specific preferred embodiments of the invention, it being understood that these embodiments are intended only as illustrative examples and the invention is not to be limited thereto.

Figure 1:
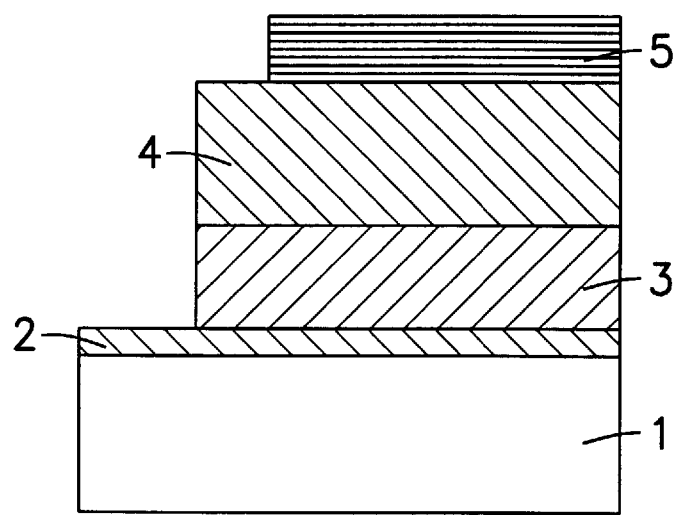
FIG. 1 shows a representative OLED for a single heterostructural device.
Figure 10:
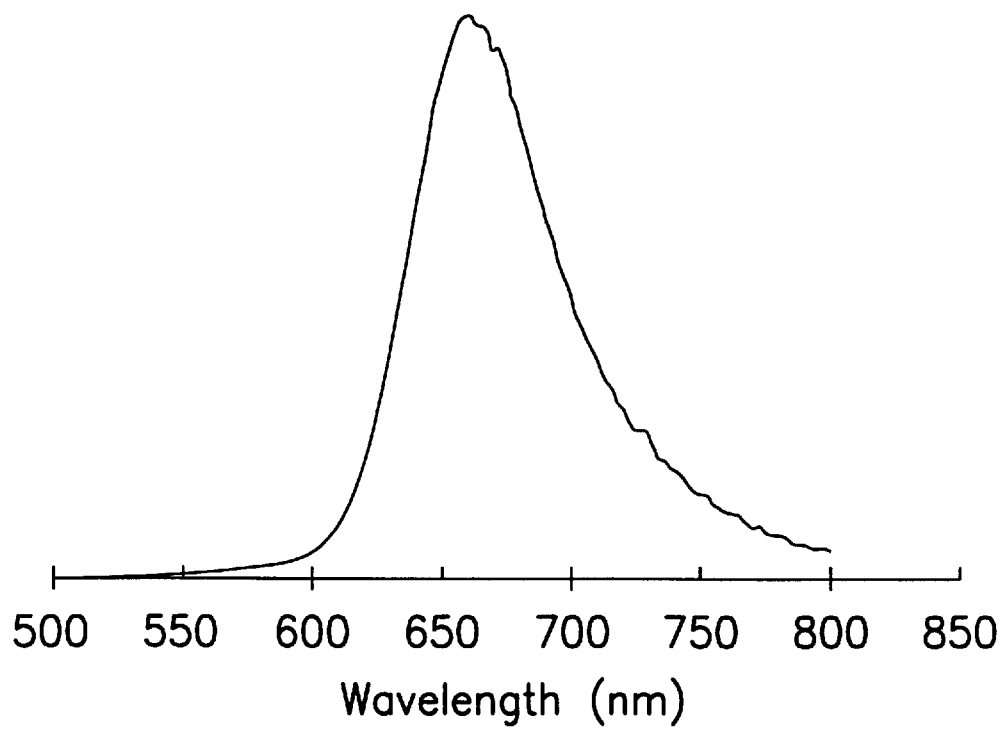
FIG. 10 shows the electroluminescent spectrum of the TPD-$Alx_3$/indigo dye compound device with a 1.7% indigo dye compound concentration.

The present invention is directed to substantially any type of OLED structure in which the disclosed host and/or dopant materials may be included in the emissive layer of a heterostructure that is used for producing electroluminescence. As used herein, the term "heterostructure for producing electroluminescence" refers to a heterostructure that includes, for a single heterostructure such as shown in FIG. 1, a hole-injecting anode layer 2, a hole transporting layer 3 in contact with the anode layer, an electron transporting layer 4 in contact with the hole transporting layer and an electron-injecting cathode layer 5 in contact with the electron transporting layer. Alternatively, if a double heterostructure is used to produce electroluminescence, a separate emissive layer (not shown in FIG. 1) is included between the hole transporting layer and the electron transporting layer. One of the electrodes of the heterostructure is in contact with a substrate 1. Although FIG. 1 shows the anode to be in contact with the substrate, the cathode may, instead, be in contact with the substrate. Each electrode is in contact with a power supply for providing voltage across the heterostructure. In addition, when the heterostructure is in a stacked OLED (SOLED), one or both of the electrodes of an individual heterostructure may be in contact with an electrode of an adjacent heterostructure. Electroluminescence is produced by the emissive layer of the heterostructure when a voltage of proper polarity is applied across the heterostructure. This electroluminescence is understood to be produced by the recombination of holes and electrons in the electron transporting layer of a single heterostructure and in the separate emissive layer of a double heterostructure. In addition to the above-noted layers, additional layers may also be present in the heterostructure, for example, to protect the cathode layer from oxidation or to protect a just deposited layer from damage that may be caused during deposition of the next layer. For example, the OLED may include a protection layer between the hole transporting layer and the ITO. This protection layer may be formed by the deposition of 3,4,9,10-perylenetetracarboxylic dianhydride (PTCDA), bis(1,2,5-thiadiazolo)-p-quinobis(1,3-dithiole) (BTQBT), copper phthalocyanine (CuPu) or other suitable, more rigid organic materials.

The single or double heterostructures, as referred to herein, are intended solely as examples for showing how an OLED embodying the present invention may be fabricated without in any way intending the invention to be limited to the particular sequence or order of making the layers shown. For example, a single heterostructure typically includes a substrate which may be opaque or transparent, rigid or flexible, and/or plastic, metal or glass; a first electrode, which is typically a high work function, hole-injecting metal anode layer, for example, an indium tin oxide (ITO) anode layer; a hole transporting layer; an electron transporting layer; and a second electrode layer, for example, a low work function, electron-injecting, metal cathode layer of a magnesium-silver alloy, (Mg:Ag). Dependent on whether the (Mg:Ag) cathode layer serves as the top electrode of the device, in which case, it may be covered with an opaque protective metal layer, for example, a layer of Ag for protecting the cathode layer from atmospheric oxidation; or on whether the (Mg:Ag) cathode layer serves as a substantially transparent top layer of a TOLED, in which case, the (Mg:Ag) cathode layer is covered with a relatively thin layer of substantially transparent ITO. In a TOLED, the relatively thin substantially transparent ITO layer may function as the electrical contact layer of the TOLED in addition to functioning as the hole-injecting anode layer of the adjacent OLED layer.

When the OLED is comprised of a double heterostructure having an additional layer of emissive material between the hole transporting and electron transporting layers, this additional layer may be referred to as a "separate emissive layer" so as to distinguish it from the electron transporting layer of a single heterostructure that functions both as the electron transporting layer as well as the emissive layer that produces the electroluminescence. The term "emissive layer" as used herein, thus, may refer either to the emissive, electron transporting layer of a single heterostructure or the separate emissive layer of a double heterostructure.

Inverted OLEDs (IOLEDs) are devices in which the order of placing the sequence of layers onto the substrate is reversed. In particular, for a single heterostructure, the electron-injecting cathode layer is deposited onto the substrate, the electron transporting layer is deposited on the cathode, the hole transporting layer is deposited on the electron transporting layer and the hole-injecting anode layer is deposited on the hole transporting layer.

Although not limited to the thickness ranges recited herein, the substrate (element 1 in FIG. 1) may be as thin as 10μ, if present as a flexible plastic or metal foil substrate, or substantially thicker if present as a rigid, transparent or opaque, substrate; the ITO anode layer may be about 500 Å (1Å=$10^{-8}$ cm) to greater than about 4000 Å thick; the hole transporting layer about 50 Å to greater than about 1000 Å thick; the separate emissive layer of a double heterostructure about 50 Å to about 200 Å thick; the electron transporting layer about 50 Å to about 1000 Å thick; and the metal cathode layer about 50 Å to greater than about 100 Å thick, or substantially thicker if the cathode layer includes a protective silver layer and is opaque. The PTCDA protection layer, if present, may be from about 50 Å to about 500 Å thick.

The emission of red light in light emitting devices has been accomplished previously with emitting compounds that emit light in the region of 640 nm to 740 nm. Clarity of the emission, however, has been problematical because the light is emitted at wavelengths which deviate significantly (i.e., <650 nm) from those associated with saturated red. For example, emissions at about 675 nm are in the deep red region, while emissions somewhat below 650 nm generally result in a faded red emission. It is therefore desirable to formulate an OLED which is capable of emitting saturated red light with wavelengths in a region closely defined around 650 nm. For comparison purposes, the CIE color coordinates for a red video signal, according to the International Telecommunications Union (ITU) would be x=0.6430; y=0.330.

In accordance with some of the embodiments of the present invention, a dopant capable of shifting the emission wavelength of an emissive layer comprised only of a host compound, is added to a host compound in an amount effective to shift the wavelength of emission so that the LED device emits light that is perceived by the human eye to be close to a saturated red color. Although it is recognized that characterization of color perception is a subjective exercise, a quantitative chromaticity scale has been developed by the Commission Internationale de l'Eclairage (International Commission of Illumination), otherwise known as the CIE standard. According to this standard, a saturated red color may be represented by a single point, with specific quantitative coordinates according to the defined axes of the chromaticity scale. It will be appreciated by one of skill in the art that such a single point on the CIE scale would represent a standard or a goal that, in practical terms, is difficult, but fortunately, unnecessary, to attain.

In the preferred embodiments of the present invention in which the OLED produces a predominantly red emission, the dopants are incorporated into a host compound so that the OLED emits light that is perceived by the human eye to be close to a saturated red color. Through the practice of the present invention, it is intended that OLEDs be constructed which can be characterized by an emission that is close to an absolute (or saturated) chromaticity value, as that would be defined by the CIE scale. Furthermore, LED's utilizing the materials of the present invention are also intended to be capable of a display brightness that can be in excess of 100 cd/m$^2$ although somewhat lower values, perhaps as low as 10 cd/m$^2$, may be acceptable in certain cases.

The host compounds as defined herein are compounds which can be doped with dopants to emit light with the desired spectral characteristics. Such compounds include, but are not limited to, both emitting compounds and host compounds as described in U.S. patent application Ser. No. 08/693,359, filed 6 Aug. 1996, incorporated herein by reference. The term "host" is used to refer to the compound in the emissive layer that functions as the component which receives the hole/electron recombination energy and then by an emission/absorption energy transfer process, transfers that excitation energy to the dopant compound, which is typically present in much lower concentrations. The dopant may then relax to an excited state having a slightly lower energy level, which preferentially radiates all of its energy as luminescent emission in a desired spectral region. A dopant that radiates 100% of the dopant's excited state excitation energy is said to have a quantum efficiency of 100%. For host/dopant concentrations which are to be used in a color tunable SOLED, preferably most, if not all, of the host's excitation energy is transferred to the dopant which in turn radiates, perhaps from a lower energy level, but with a high quantum efficiency to produce visible radiation having a desired chromaticity. The present invention is directed toward classes of compounds that are intended to serve as hosts and/or dopants, together or with still other hosts and/or dopants, so as to satisfy these demanding energy transfer requirements.

As the term host compound is used herein, it will be appreciated that such compounds can be found in either an electron transporting/emissive layer of a single heterostructure OLED device or in the separate emissive layer of a double heterostructure device. As will be recognized by one of skill in the art, the use of the host and dopant species such as disclosed herein makes it possible to extend not only the range of colors emitted by the OLED, but also to extend the range of possible candidate species for host and/or dopant compounds. Accordingly, for effective host/dopant systems, although the host compound can have a strong emission in a region of the spectrum where the dopant species strongly absorbs light, the host species preferably does not have an emission band in a region where the dopant also emits strongly. In structures where the host compound also functions as a charge carrier, then additional criteria such as redox potential for the species also becomes a consideration. In general, however, the spectral characteristics of the host and dopant species are the most important criteria.

The amount of dopant that is present is that amount which is sufficient to shift the emission wavelength of the red emitting material as close as possible to saturated red, as that would be defined according to the CIE scale. Typically, the effective amount is from about 0.01 to 10.0 mol %, based on the emitting layer. The preferred amount is from about 0.1 to 1.0 mol %. The primary criterion for determining an appropriate doping level is the level which is effective for achieving an emission with the appropriate spectral characteristics. By way of example, and without limitation, if the amount of dopant species is at too low a level, then emission from the device will also comprise a component of light from the host compound itself, which will be at shorter wavelengths than the desired emission form the dopant species. In contrast, if the level of dopant is too high, emission efficiencies could be adversely affected by self-quenching, a net non-emissive mechanism. Alternatively, too high levels of the dopant species could also adversely affect the hole or electron transporting properties of the host material.

Thus, while there may be substantial variation in the type, number, thickness and order of the layers that are present, dependent on whether the device includes a single heterostructure or a double heterostructure, whether the device is a stacked OLED or a single OLED, whether an inverted sequence of OLED layers is present, whether the OLED is intended to produce a predominantly red emission, or whether still other design variations are used, the present invention is directed to those devices in which the OLED is comprised of a heterostructure for producing electroluminescence which has an emissive layer containing at least one of the host and/or dopant materials as disclosed herein. For example, one of the embodiments of the present invention is directed to an emissive layer containing a host material of a metal complex of (5-hydroxy)quinoxaline,

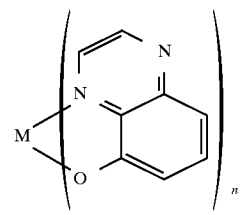

wherein M is Al, Ga, In, Zn or Mg, with n=3, if M is Al, Ga or In and n=2, if M is Zn or Mg.

More specifically, one of the embodiments of the present invention is directed to dopant materials comprised of an inner salt having the chemical structure of formula III:

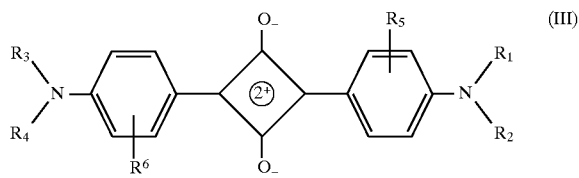

wherein $R_1$, $R_2$, $R_3$ and $R_4$ are, independently of each other, an unsubstituted or substituted alkyl, aryl or heterocycle (for example, a pyrole), and $R_5$ and $R_6$ are, independently of each other, an unsubstituted or substituted alkyl, aryl, OH or $NH_2$. Such compounds are herein referred to as bisphenyl-squarilium compounds.

Still more specifically, one of the embodiments of the present invention is directed to dopant materials comprised of an inner salt of a compound having the chemical structure of formula IV:

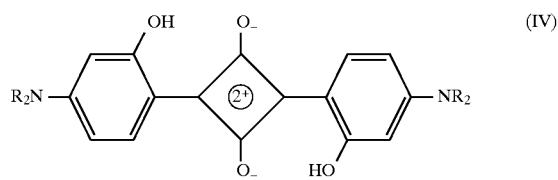

wherein R=an alkyl. Such compounds are herein referred to as squarilium dyes.

Another embodiment of the present invention is directed to dopant materials comprised of an indigo dye compound having the chemical structure of formula V:

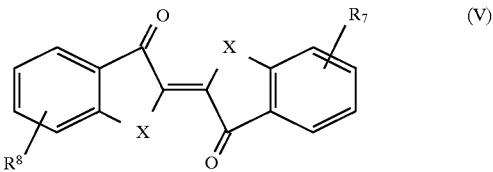

wherein X=NH, $NR_9$, S, Se, Te, or O, wherein $R_9$ is alkyl or phenyl, and $R_7$ and $R_8$ are, independently of each other, an unsubstituted or substituted alkyl or aryl group, or a Π-electron donor group such as —OR, —Br, —$NR_2$, etc. or a Π-electron acceptor group such as —CN, —$NO_2$, etc.

Still more specifically, another of the embodiments of the present invention is directed to dopant materials comprised of an indigo dye compound having the chemical structure of formula VI:

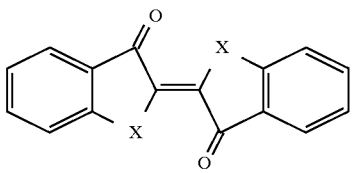

wherein X=NH.

Still another embodiment of the present invention is directed to dopant materials comprised of a fullerene compound, for example, the $C_{60}$ fullerene compound.

Methods for preparing each of the disclosed dopant compounds are known in the art.

As an illustrative example of the present invention, the host compound, aluminumtris(5-hydroxy-quinoxaline), ("Alx$_3$") is preferably comprised of the compound of formula I wherein M=Al and n=3:

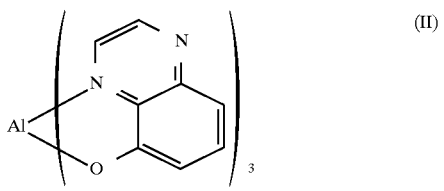

and the dopant compound is preferably comprised of the squarilium dye compound of formula IVa, 1,3-bis[4-(dimethylamino)-2-hydroxyphenyl]-2,4-dihydroxycyclobuteneolyllum dihydroxide,bis(inner salt) [63842-83-1]:

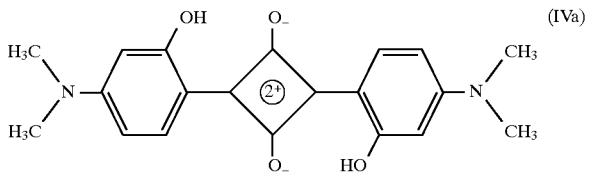

Vacuum-deposited, single heterostructural OLEDs have been made having an electron transporting layer comprised of a host compound of formula II and a dopant compound of formula IVa, wherein the OLED has current-voltage (I–V) characteristics, UV-visible, photoluminescence and electroluminescence properties that are particularly suitable for OLEDs. It is believed that the effectiveness of this particular host/dopant combination is based on achieving a high level of energy transfer from the host to the dopant. Such a high level of energy transfer, in some cases for suitably matched hosts and dopants, can lead to more efficient electroluminescence as compared to when the host compound is used alone. While not intending to be limited by the theory of the invention for the representative embodiments as disclosed herein, as a means of illustrating how such combinations of host and dopant compounds can be selected and matched to provide efficient electroluminescence (EL), the photoluminescence (PL) of the host Alx$_3$ compound, with and without the dopant dye compound, may be compared with Alq$_3$:

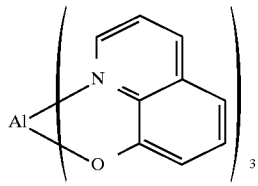

which was also prepared with and without the dopant compound.

The PL of these compounds may be measured using standard techniques, for example, by immersing the compounds in a solvent, exposing them to a photoexcitation source and measuring the photoluminescence spectrum as a function of wavelength using equipment such as is available from Photon Technology International, in Somerville, N.J.

Figure 2:
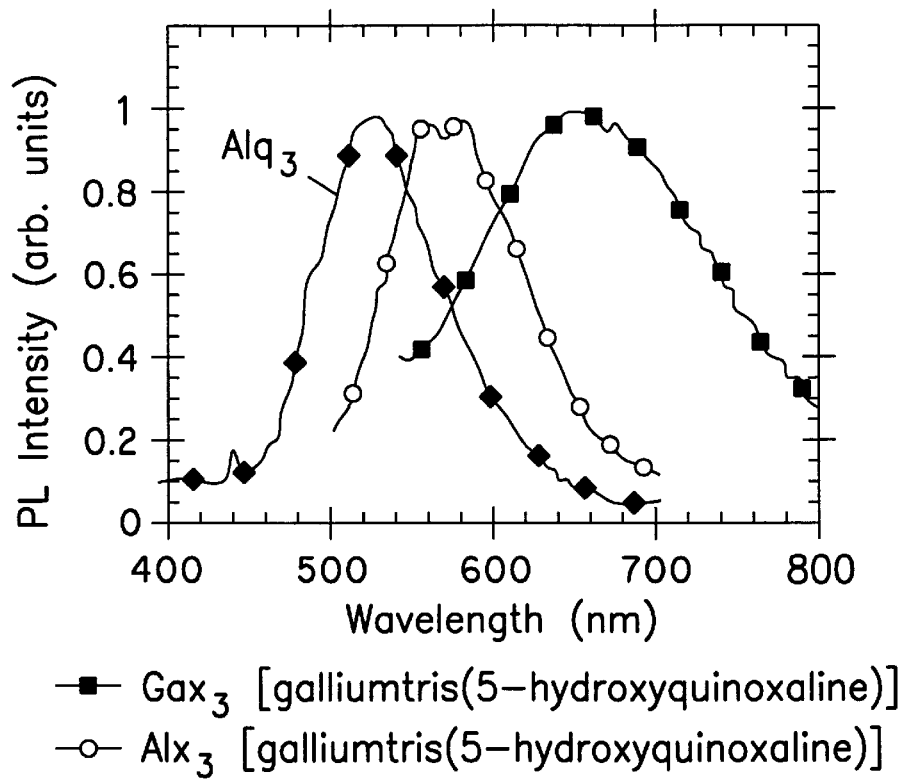
FIG. 2 shows the photoluminescence (PL) spectra of aluminumtris(5-hydroxy-quinoxaline), aluminumtris(5-hydroxyquinoline) and gallium bis(5-hydroxy-quinoxaline).
Figure 3:
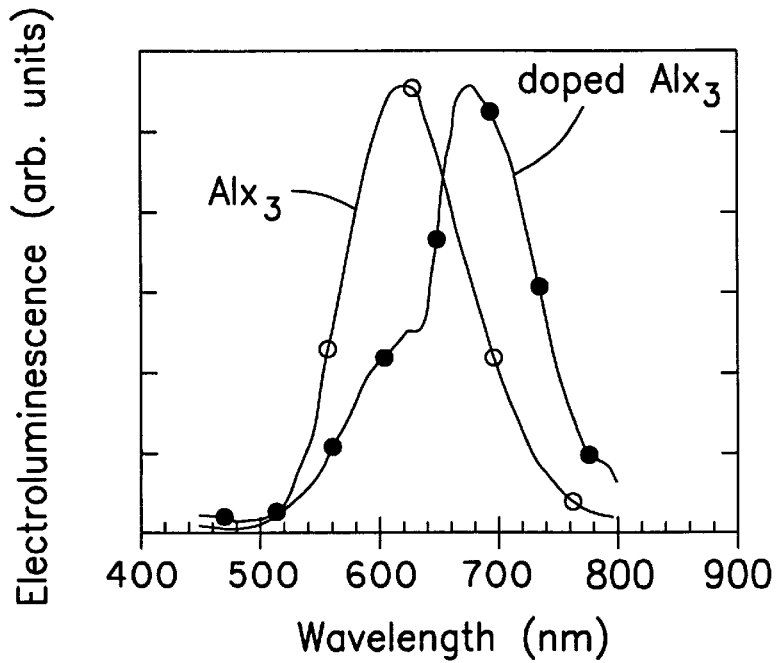
FIG. 3 shows the electroluminescence spectra of OLEDs containing an emissive layer of aluminumtris(5-hydroxyquinoxaline) with and without the inner salt of a bisphenyl-squarilium compound of formula III as a dopant.

The PL spectrum of Alq$_3$, Alx$_3$ and Gax$_3$ is shown in FIG. 2. The Alx$_3$ produces an orange photoluminescence with a maximum at about 620 nm, which is significantly red shifted relative to Alq$_3$, which has a PL maximum at about 515 nm. It is believed that this large red shift can be significant in helping to achieve the high level of energy transfer from the host Alx$_3$ compound to the red fluorescent dye dopant. The EL spectra of OLEDs prepared with an un-doped and doped Alx$_3$ layer are shown in FIG. 3. Whereas the undoped host material has an EL spectrum that is slightly red shifted as compared with the PL spectrum of the host material, the maximum occurs in a wavelength region that still has an orange appearance, as characterized, for example, by the standard CIE calorimetric system (x=0.565, y=0.426). However, when this host material is doped with the inner salt dye of formula IVa, the EL spectrum has a maximum in a wavelength region that is significantly shifted toward the red (x=0.561, y=0.403).

Figure 5:
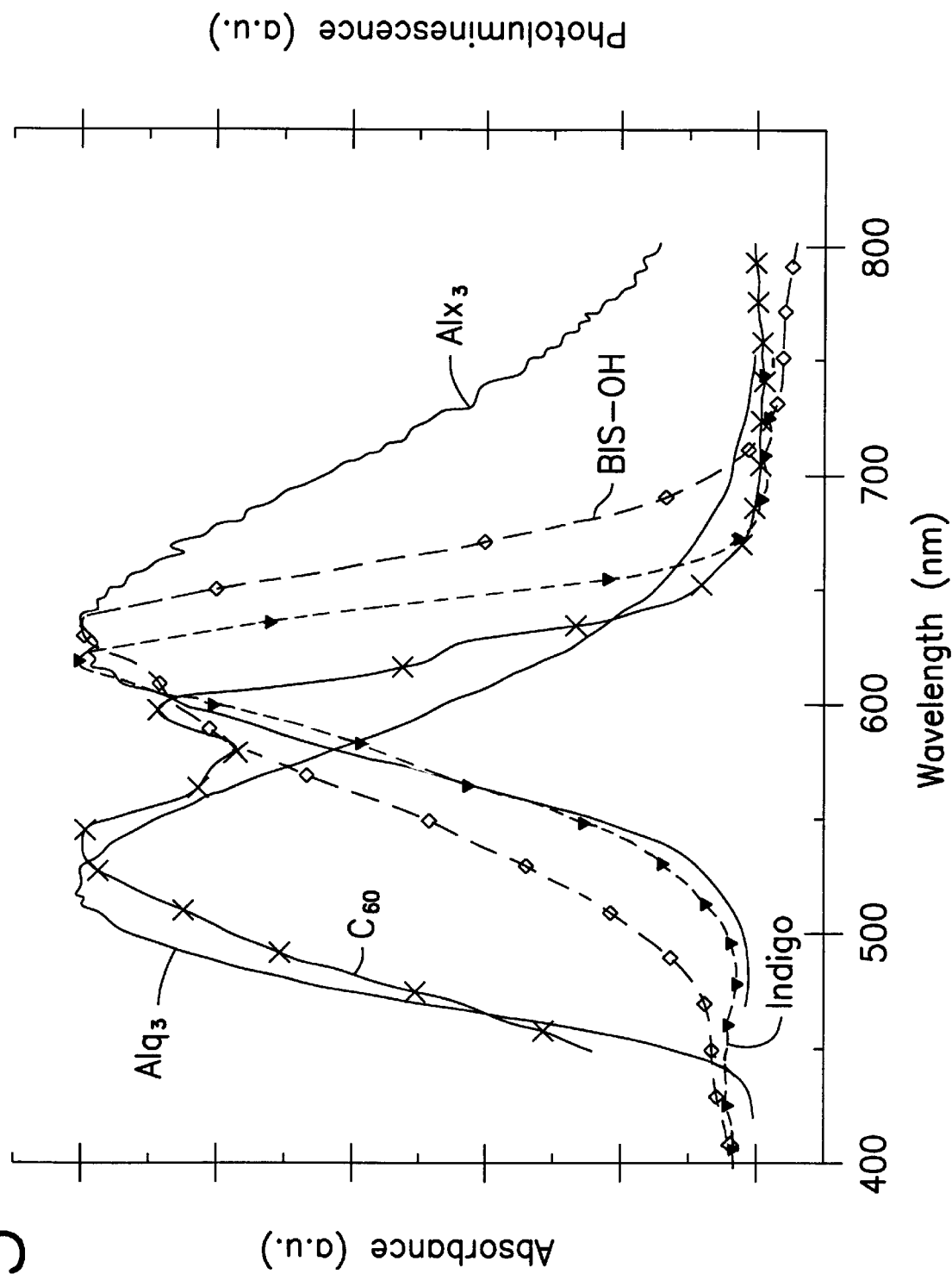
FIG. 5 shows the photoluminescent spectra of the host compounds $Alq_3$ and $Alx_3$ as compared with the absorbance spectra of the dopants: the inner salt of a bisphenyl-squarilium dye ("BIS-OH") an indigo dye compound and a fullerene compound, $C_{60}$.

Further embodiments of the present invention are directed to OLEDs having an emissive layer containing a dopant comprised of an indigo dye compound of formula V or of a fullerene compound. Without in any way limiting the scope of these classes of compounds, species of these classes of compounds are represented by the indigo dye compound of formula VI and the fullerene compound $C_{60}$. The absorbance spectra of these compounds, as shown in FIG. 5, together with the bisphenol squarilium compound of formula IVa, show that these compounds have absorption bandwidths which are suitably matched to accept the photoluminescence from the host compounds Alx$_3$ and Alq$_3$.

Figure 6:
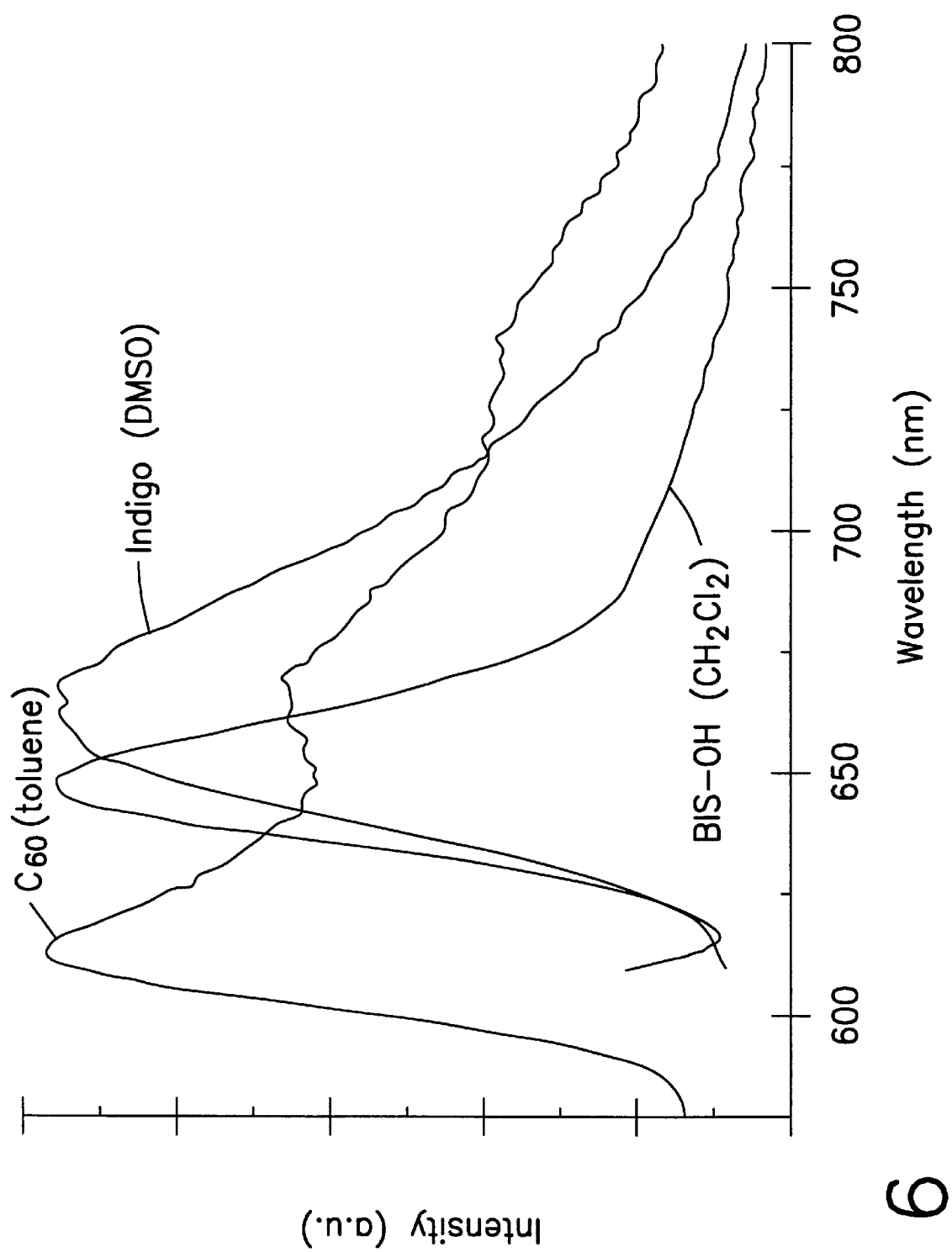
FIG. 6 shows the photoluminescent spectra of the dopant compounds in solution, the inner salt of a bisphenyl-squarilium dye ("BIS-OH") (in $CH_2Cl_2$), an indigo dye compound (in DMSO) and $C_{60}$ (in toluene).
Figure 7:
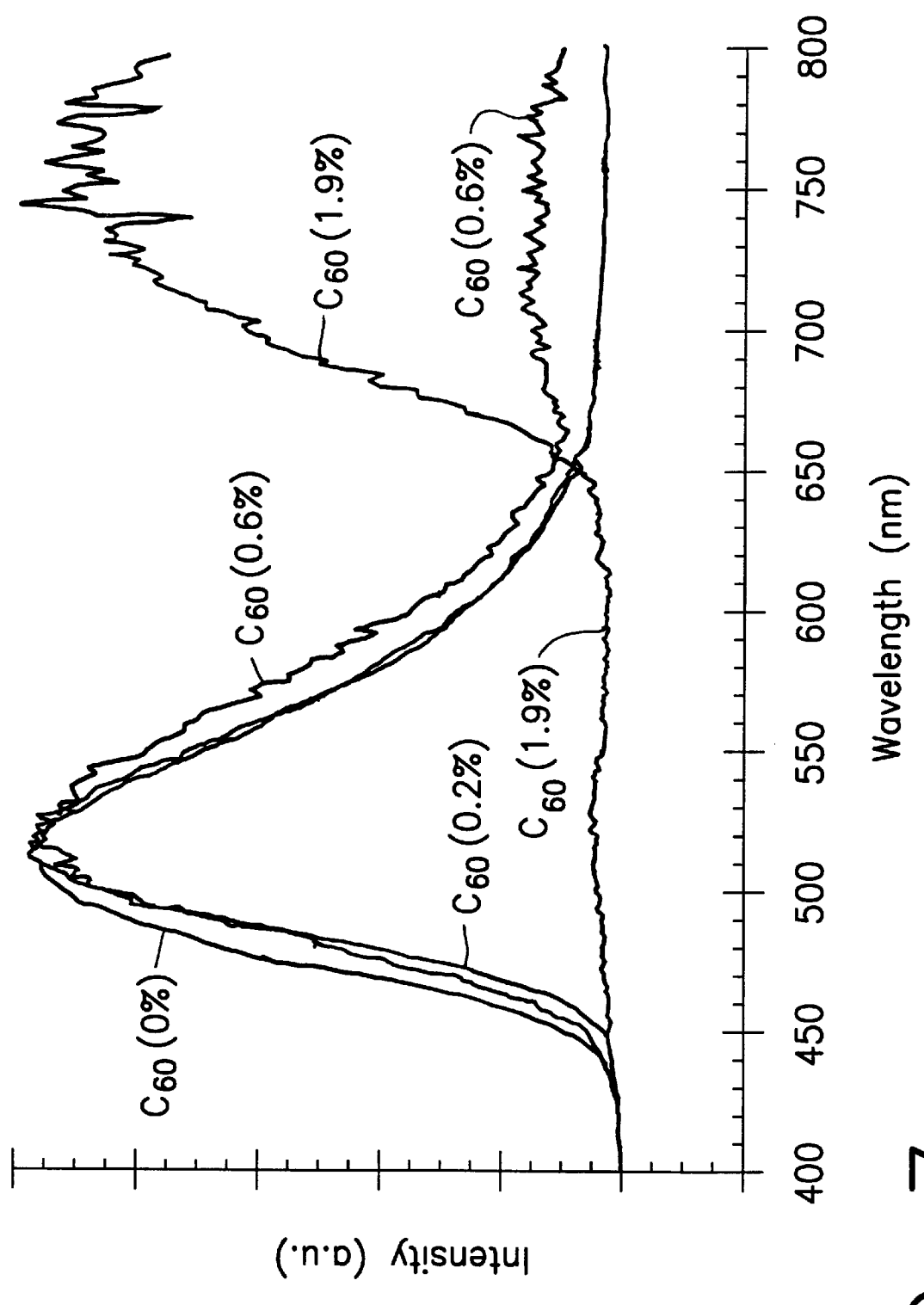
FIG. 7 shows the electroluminescent spectra of TPD-$Alq_3/C_{60}$ devices as a function of increasing $C_{60}$ concentration in the host $Alq_3$ material.
Figure 8:
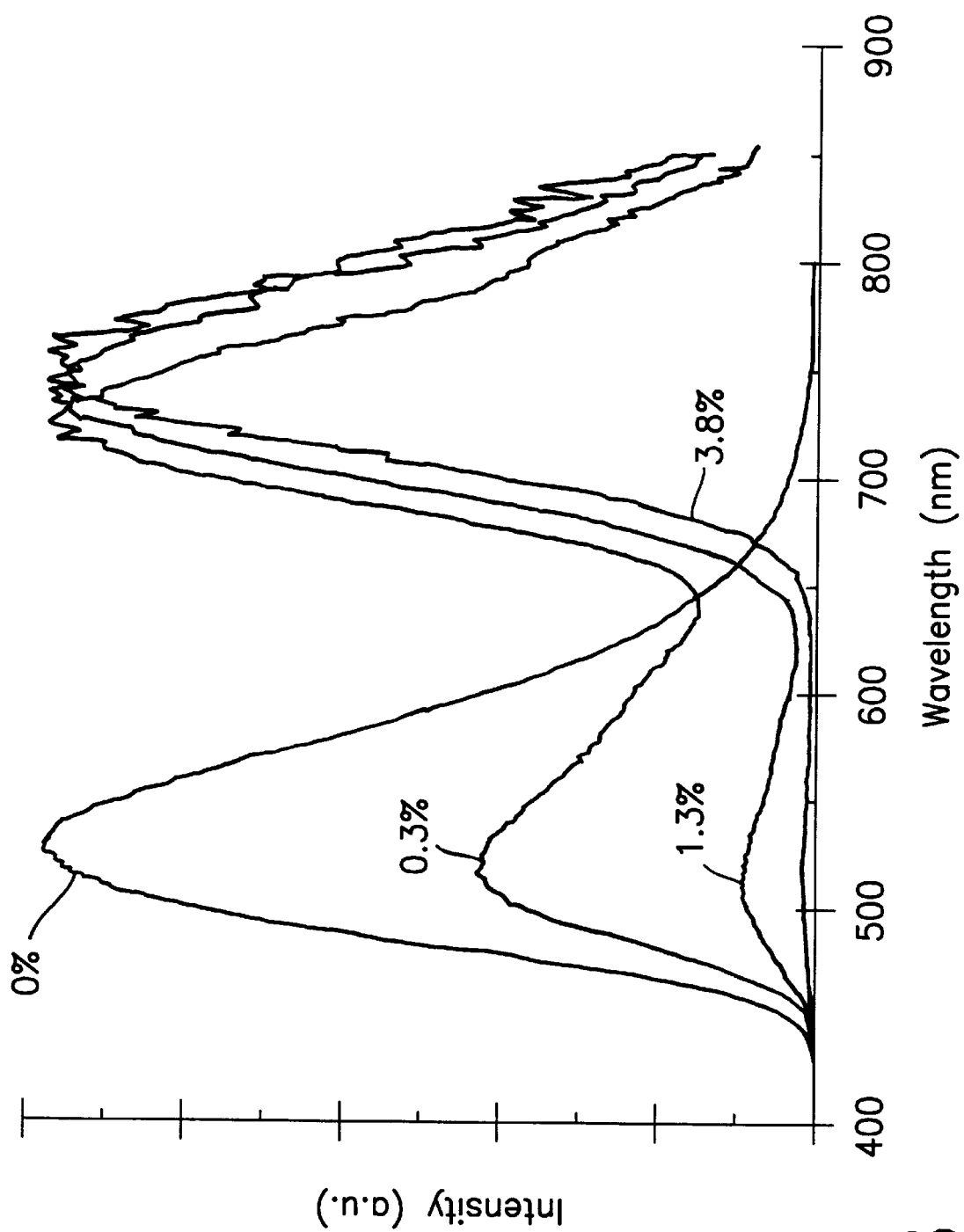
FIG. 8 shows the electroluminescent spectra of TPD-$Alq_3$/(the bisphenol-squarilium dye of formula IVa) devices as a function of the bisphenol-squarilium dopant concentration in the $Alq_3$ host material.
Figure 9:
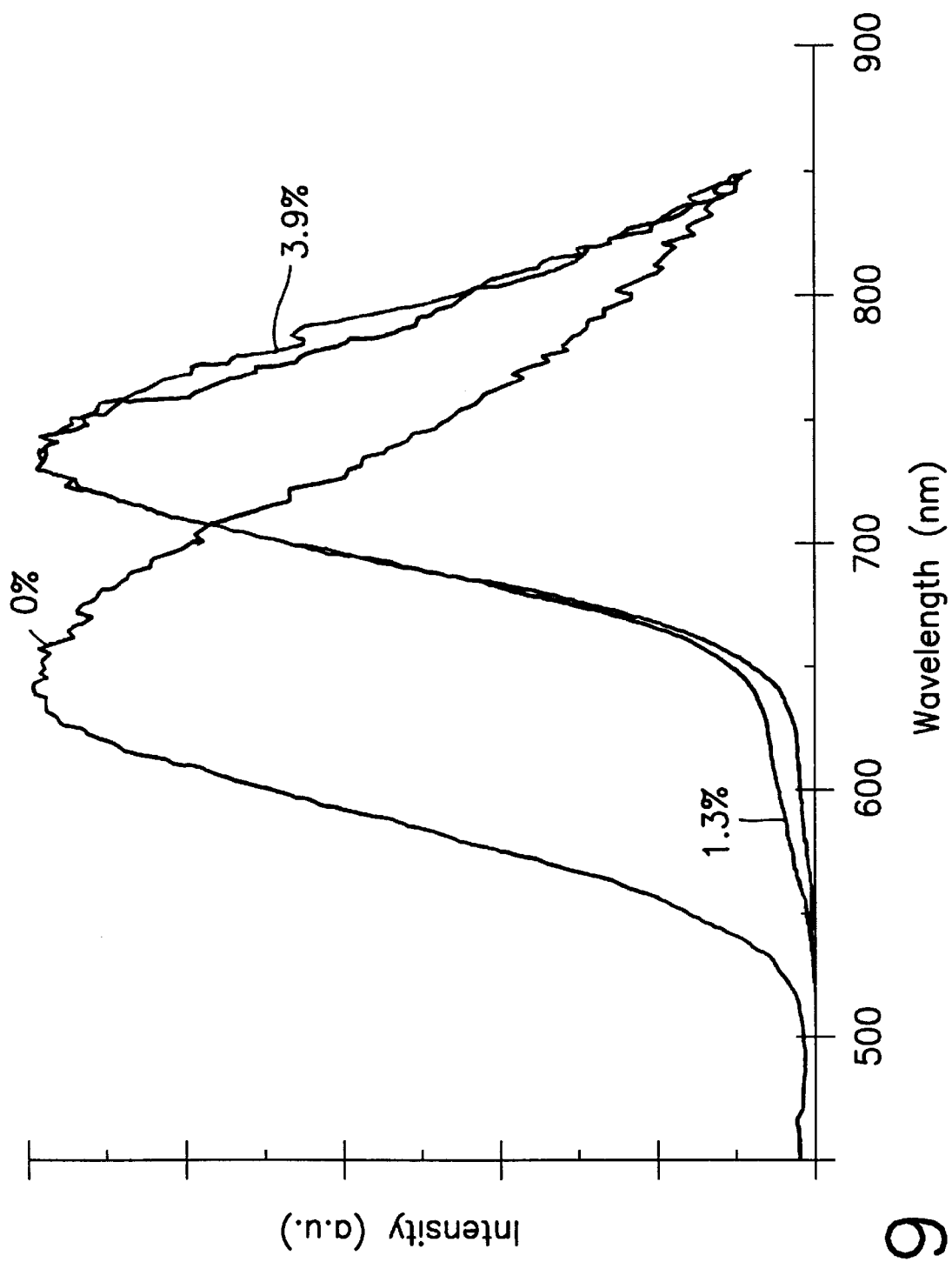
FIG. 9 shows the electroluminescent spectra of TPD-$Alx_3$/(the bisphenol-squarilium dye of formula IVa) devices as a function of the bisphenol-squarilium dopant concentration in the host $Alx_3$ material.

The photoluminescent spectra of these dopants, as shown in FIG. 6, show that each of these compounds produces luminescence in or toward the red region of the visible spectrum. Furthermore, as illustrated by the electroluminescent spectra of OLEDs incorporating the fullerene or squarilium dye dopants in a single heterostructural device using Alx$_3$ or Alq$_3$ as the host material, each of these compounds is shown to be capable, at sufficient dopant concentrations, of having the excitation energy completely transferred from the host, see FIGS. 7, 8 and 9. Part of that energy is then radiated as electroluminescence by the dopant. The capacity for a dopant to replace substantially all of the emission of the host compound with that of the dopant is of particular benefit, for example, in a color tunable SOLED. In such devices, which have more than one color-emitting layer, it is desirable to have each layer with its own well-defined chromaticity and with a spectral emission that does not overlap the spectral emission of any other layer.

The electroluminescent emission of an OLED containing the representative indigo dye compound is shown to have an emission band having a maximum near 650 nm (with CIE values, x=0.693 and y=0.305), which produces a saturated red appearance.

The Zn and Mg derivatives of (5-hydroxy)quinoxaline have also been prepared and found to produce PL spectra nearly identical to that observed for Alx$_3$. In view of the effectiveness of Alx$_3$ as a host material for red-emitting dopants wherein there is also a good energy match, such PL spectra show that the Zn and Mg derivatives may also be useful as host materials for suitably selected red-emitting dopants.

The Ga derivative of (5-hydroxy)quinoxaline has also been prepared and found to have the PL emission spectrum as shown in FIG. 2. These results show that the Ga analog may be effective not only as a doped emissive material, but also as an un-doped material.

The OLEDs may be prepared using the materials, techniques and apparatus such as described, for example, in co-pending applications, "High Reliability, High Efficiency, Integratable Organic Light Emitting Devices and Methods of Producing Same," Ser. No. 08/774,119; "Novel Materials for Multicolor LED's," Ser. No. 08/771,815; "Electron Transporting and Light Emitting Layers Based on Organic Free Radicals," Ser. No. 08/774,120; "Multicolor Display Devices," Ser. No. 08/772,333; and "Red-Emitting Organic Light Emitting Devices (LED's)," Ser. No. 08/774,087, each of said co-pending applications being filed on Dec. 23, 1996; "Vacuum Deposited, Non-Polymeric Flexible Organic Light Emitting Devices," Ser. No. 08/789,319, said co-pending application being filed on Jan. 23, 1997; "Driving Circuit for Stacked Organic Light Emitting Devices," Ser. No. 08/792,050; "Displays Having Mesa Pixel Configuration," Ser. No. 08/794,595; and "Stacked Organic Light Emitting Devices," Ser. No. 08/792,046, each of said co-pending applications being filed on Feb. 3, 1997. The present invention as disclosed herein may be used in conjunction with the subject matter of any one or more of these co-pending application, which are each incorporated herein in their entirety by reference. The present invention may also be used in conjunction with the subject matter of each of co-pending U.S. patent applications Ser. Nos. 08/354,674, 08/613,207, 08/632,316, 08/632,322 and 08/693,359 and U.S. provisional patent applications Ser. Nos. 60/010,013 and 60/024,001, each of which is also herein incorporated in its entirety by reference.

This invention will now be described in detail with respect to showing how certain specific representative embodiments thereof will be made, the materials, apparatus and process steps being understood as examples that are intended to be illustrative only. In particular, the invention is not intended to be limited to the methods, materials, conditions, process parameters, apparatus and the like specifically recited herein.

EXAMPLES

OLEDs were prepared by successively depositing the OLED layers on a commercially available borosilicate glass substrate that was precoated with ITO.

In these particular embodiments, in which the host/dopant materials of the present invention were prepared and incorporated into an OLED, the hole transport layer was comprised of N,N'-diphenyl-N,N'-bis(3-methylpheny)1-1'biphenyl-4,4'diamine (TPD), and the electron transporting layer was comprised of the doped or undoped tris-(5-hydroxyquinoxaline) aluminum ($Alx_3$) or of doped or undoped $Alq_3$.

The hole transporting material TPD and the electron transporting materials $Alq_3$ and $Alx_3$ were synthesized according to literature procedures, and were sublimed before use.

The dopant $C_{60}$ was purchased from Southern Chemical Group, LLC, and used as received.

The bisphenol-squarilium dopant of formula IVa and the indigo dye compound dopant were purchased from Aldrich and sublimed twice to give the pure green and purple crystalline materials, respectively.

Aluminum tris (5-hydroxyquinoxaline), ($Alx_3$), was prepared by the reaction of aluminum trisisopropoxide with 5-hydroxyquinoxaline in isopropanol under argon. Isopropanol was dried over $CaH_2$ before use. The amount of the ligand taken for the reaction was in slight excess. The isopropanol mixture was refluxed under argon for one and a half hours, and orange product was isolated by rotarvaporization.

Gallium tris(5-hydroxyquinoxaline), ($Gax_3$), was formed by mixing 200 ml water solution of 0.2 g $Ga(NO_3)_3 \cdot xH_2O$ and an excess of 1% alcoholic solution of the ligand at 60° C., followed by 10% ammonium hydroxide addition to make the solution slightly basic. Orange precipitate was obtained, and, after cooling, filtered off. The $Gax_3$ preparation was similar to that described in Spectrochimica Acta, 1956, Vol. 8, pp. 1–8.

For the reagents, 5-hydroxyquinoxaline was prepared according to S. K. Freeman, P. E. Spoerri, J. Org. Chem., 1951, 16, 438; aluminum trisisopropoxide (99.99% purity) and $Ga(NO_3)_3 \cdot xH_2O$ (99.999% purity) were bought from Aldrich; and isopropanol was obtained from Fisher Scientific.

The ITO/Borosilicate substrates ($100\Omega$/square) were cleaned by sonicating with detergent for five minutes followed by rinsing with deionized water. They were then treated twice in boiling 1,1,1-trichloroethane for two minutes. The substrates were then sonicated twice with acetone for two minutes and twice with methanol for two minutes.

The background pressure prior to deposition was normally $7 \times 10^{-7}$ torr or lower and the pressure during the deposition was about $5 \times 10^{-7}$ to $1.1 \times 10^{-6}$ torr.

All the chemicals were resistively heated in various tantalum boats. TPD was first deposited at a rate from one to four Å/s. The thickness was typically controlled at about 300 Å.

The electron transporting layer ($Alq_3$, $Alx_3$) was doped with various dyes ($C_{60}$, the bisphenol squarilium dye and the indigo dye compound of formula VI). Typically, the dopant was first vaporized with the substrates covered. After the rate of the dopant was stabilized, the host material was vaporized at the prescribed rate. The cover over the substrates was then opened and the host and guest were deposited at the desired concentration. The rate of dopant was normally 0.1–0.2 Å/s. The total thickness of this layer was controlled at about 450 Å.

The substrates were then released to air and masks were put directly on the substrates. The masks are made of stainless steel sheet and contain holes with diameters of 0.25, 0.5, 0.75, and 1.0 mm. The substrates were then put back into vacuum for further coating.

Magnesium and silver were co-deposited at a rate normally of 2.6 Å/s. The ratio of Mg:Ag varied from 7:1 to 12:1. The thickness of this layer was typically about 500 Å. Finally, 1000 A Ag was deposited at the rate between one to four Å/s.

Figure 4:
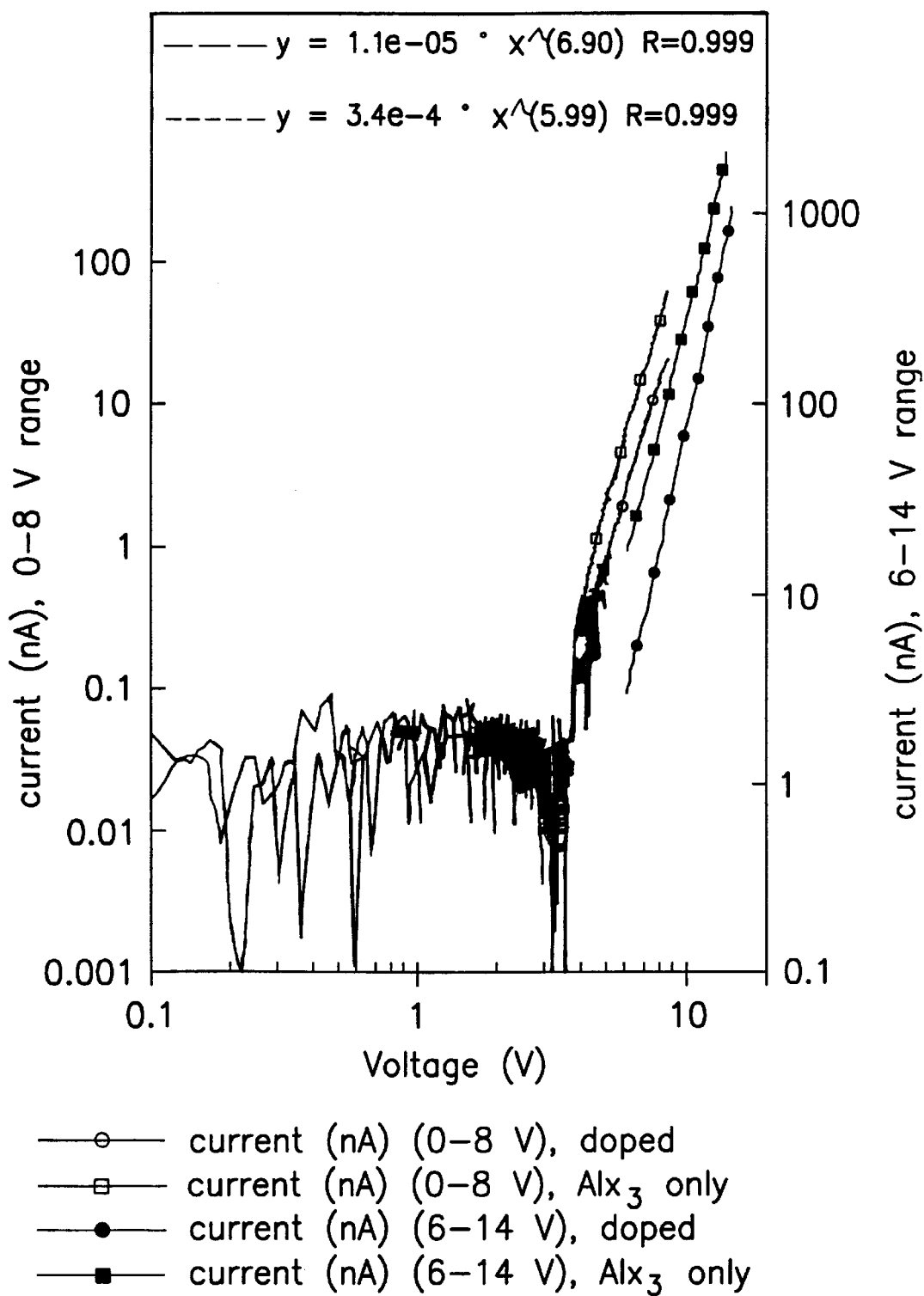
FIG. 4 shows the I–V characteristics of aluminumtris (5hydroxy-quinoxaline) with and without the inner salt of a bisphenyl-squarilium compound of formula III as the dopant.

The I–V characteristics of these OLEDs were measured and are shown for the doped and undoped $Alx_3$ in FIG. 4. The close similarity of the results with and without the dopant shows that the dopant is not perturbing the electrical properties of the device.

For the OLEDs containing an emissive electron transporting layer of $Alq_3$ as the host material with and without the same fluorescent dye dopant, wherein the energy match between the host material and the dopant was poor, nearly all of the EL emission was obtained from the $Alq_3$.

Those of skill in the art may recognize certain modifications to the various embodiments of the invention, which modifications are meant to be covered by the spirit and scope of the appended claims.

What is claimed is:

1. An organic light emitting device for producing electroluminescence comprising:

a heterostructure for producing electroluminescence, said heterostructure having an emissive layer comprised of a host material and a dopant, said host material being comprised of a metal complex of (5-hydroxy) quinoxaline having the chemical structure of formula I:

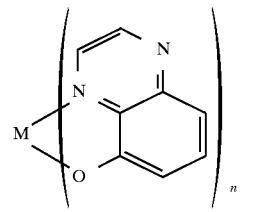
(I)

wherein M is Al, Ga, In, Zn or Mg, with n=3, if M is Al, Ga or In and n=2, if M is Zn or Mg.

2. The organic light emitting device of claim 1 wherein the metal complex of (5-hydroxy)quinoxaline comprises an aluminum complex having a chemical structure of formula II:

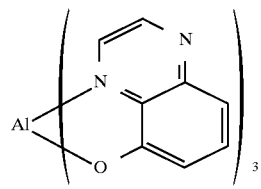
(II)

3. The organic light emitting device of claim 1 wherein said dopant is comprised of a bisphenyl-squarilium compound of formula III:

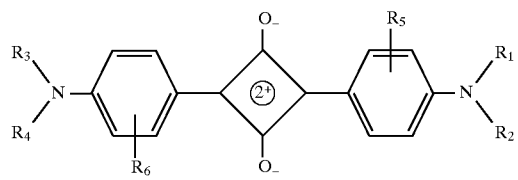
(III)

wherein $R_1$, $R_2$, $R_3$ and $R_4$ are, independently of each other, an unsubstituted or substituted alkyl, aryl or heterocycle, and $R_5$ and $R_6$ are, independently of each other, an unsubstituted or substituted alkyl, aryl, OH or $NH_2$.

4. The organic light emitting device of claim 1 wherein said dopant comprises a squarilium dye having a chemical structure of formula IV:

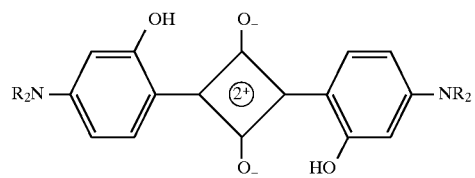
(IV)

wherein R=alkyl.

5. The organic light emitting device of claim 1 wherein said dopant comprises the squarilium dye having the chemical structure:

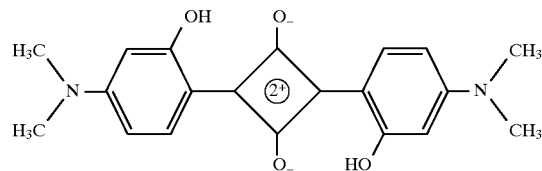

6. The organic light emitting device of claim 1 wherein said dopant comprises an indigo dye compound having a chemical structure of formula:

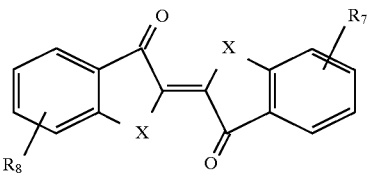

wherein X=NH, $NR_9$, S, Se, Te, or O, wherein $R_9$ is alkyl or phenyl, and $R_7$ and $R_8$ are, independently of each other, an unsubstituted or substituted alkyl or aryl group, a Π-electron donor group or a Π-electron acceptor group.

7. The organic light emitting device of claim 1 wherein said dopant comprises an indigo dye compound having a chemical structure of:

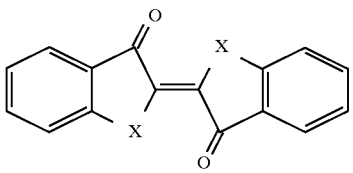

wherein X is NH.

8. The organic light emitting device of claim 1 wherein said dopant comprises a fullerene compound.

9. The organic light emitting device of claim 8 wherein said fullerene compound comprises $C_{60}$.

10. A display incorporating the organic light emitting device of claim 1.

11. A vehicle incorporating the organic light emitting device of claim 1.

12. A computer incorporating the organic light emitting device of claim 1.

13. A television incorporating the organic light emitting device of claim 1.

14. A printer incorporating the organic light emitting device of claim 1.

15. A wall, theater or stadium screen incorporating the organic light emitting device of claim 1.

16. A billboard or a sign incorporating the organic light emitting device of claim 1.

17. An organic light emitting device for producing electroluminescence comprising:

a heterostructure for producing electroluminescence, said heterostructure having an emissive layer comprised of a host material and a dopant, said dopant being comprised of a compound of formula III:

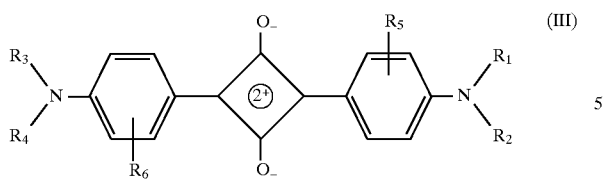

wherein $R_1$, $R_2$, $R_3$ and $R_4$ are, independently of each other, an unsubstituted or substituted alkyl, aryl or heterocycle, and $R_5$ and $R_6$ are, independently of each other, an unsubstituted or substituted alkyl, aryl, OH or $NH_2$.

18. The organic light emitting device of claim 17 wherein said dopant comprises a squarilium dye having a chemical structure of formula IV:

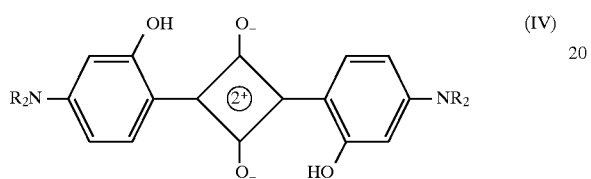

wherein R=alkyl.

19. The organic light emitting device of claim 17 wherein said dopant comprises the squarilium dye having the chemical structure:

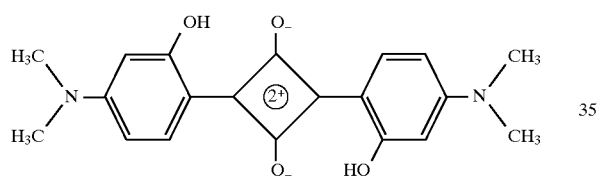

20. An organic light emitting device for producing electroluminescence comprising:

a heterostructure for producing electroluminescence, said heterostructure having an emissive layer comprised of a host material and a dopant, said dopant being comprised of an indigo dye compound of formula V:

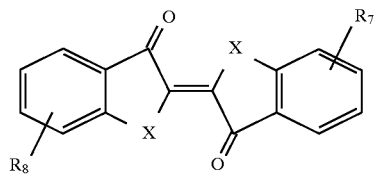

wherein X=NH, $NR_9$, S, Se, Te, or O, wherein $R_9$ is alkyl or phenyl, and $R_7$ and $R_8$ are, independently of each other, an unsubstituted or substituted alkyl or aryl group, a Π-electron donor group or a Π-electron acceptor group.

21. The organic light emitting device of claim 20 wherein said Π-electron donor group is —OR, —Br or —$NR_2$.

22. The organic light emitting device of claim 20 wherein said π-electron acceptor group is —CN or —$NO_2$.

23. The organic light emitting device of claim 20 wherein said dopant comprises an indigo dye compound having a chemical structure of formula VI:

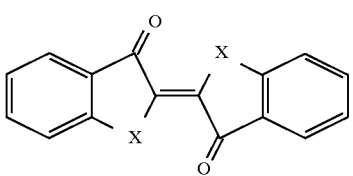

wherein X is NH.

24. An organic light emitting device for producing electroluminescence comprising:

a heterostructure for producing electroluminescence, said heterostructure having an emissive layer comprised of a host material and a dopant, said dopant being comprised of a fullerene compound.

25. The organic light emitting device of claim 24 wherein said fullerene compound comprises $C_{60}$.

26. A method of fabricating an organic light emitting device for producing electroluminescence comprising:

fabricating a heterostructure for producing electroluminescence, wherein the fabrication process includes the step of depositing a layer comprised of a host material and a dopant, said host material being comprised of a metal complex of (5-hydroxy)quinoxaline having the chemical structure of formula I:

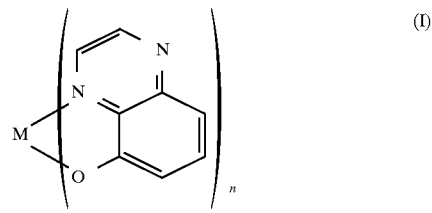

wherein M is Al, Ga, In, Zn or Mg, with n=3, if M is Al, Ga or In and n=2, if M is Zn or Mg.

27. The method according to claim 26 wherein the metal complex of (5-hydroxy)quinoxaline comprises an aluminum complex having a chemical structure of formula II:

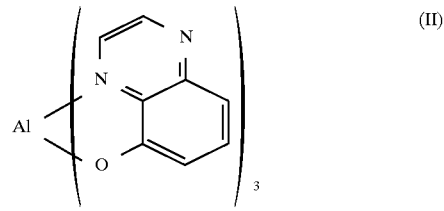

28. The method according to claim 26 wherein said dopant is comprised of a compound of formula III:

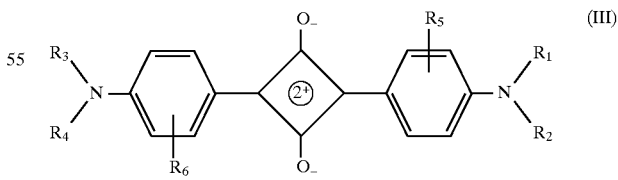

wherein $R_1$, $R_2$, $R_3$ and $R_4$ are, independently of each other, an unsubstituted or substituted alkyl, aryl or heterocycle, and $R_5$ and $R_6$ are, independently of each other, an unsubstituted or substituted alkyl, aryl, OH or $NH_2$.

29. The method according to claim 26 wherein said dopant comprises a squarilium dye having a chemical structure of formula IV:

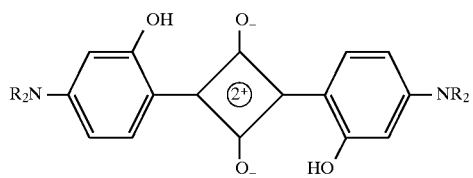

wherein R=alkyl.

30. The method according to claim 26 wherein said dopant comprises the squarilium dye having the chemical structure of formula IVa:

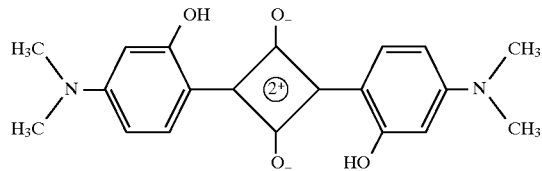

31. A method of fabricating an organic light emitting device for producing electroluminescence comprising:

fabricating a heterostructure for producing electroluminescence, wherein the fabrication process includes the step of depositing a layer comprised of a host material and a dopant, said dopant being comprised of a compound of formula III:

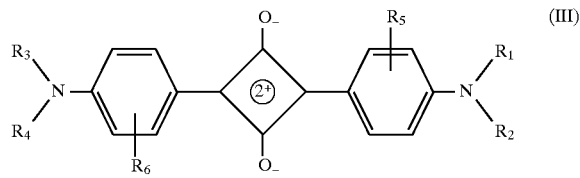

wherein $R_1$, $R_2$, $R_3$ and $R_4$ are, independently of each other, an unsubstituted or substituted alkyl, aryl or heterocycle, and $R_5$ and $R_6$ are, independently of each other, an unsubstituted or substituted alkyl, aryl, OH or $NH_2$.

32. The method according to claim 31 wherein said dopant comprises a squarilium dye having a chemical structure of formula IV:

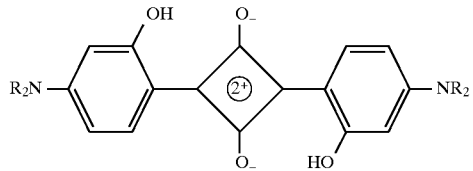

wherein R=alkyl.

33. The method according to claim 31 wherein said dopant comprises the squarilium dye having the chemical structure of formula IVa:

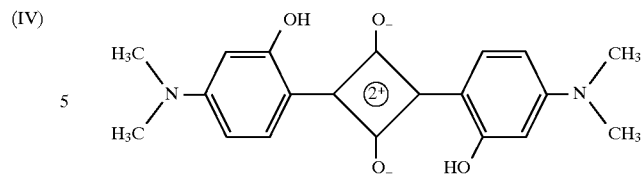

34. A method of fabricating an organic light emitting device for producing electroluminescence comprising:

fabricating a heterostructure for producing electroluminescence, wherein the fabrication process includes the step of depositing a layer comprised of a host material and a dopant, said dopant being comprised of a indigo dye compound of formula V:

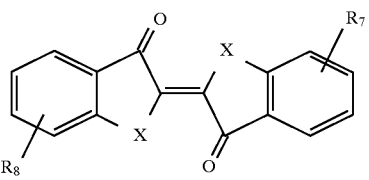

wherein X=NH, $NR_9$, S, Se, Te, or O, wherein $R_9$ is alkyl or phenyl, and $R_7$ and $R_8$ are, independently of each other, an unsubstituted or substituted alkyl or aryl group, a Π-electron donor group or a Π-electron acceptor group.

35. The method according to claim 34 wherein said Π-electron donor group is —OR, —Br or —$NR_2$.

36. The method according to claim 34 wherein said π-electron acceptor group is —CN or —$NO_2$.

37. The method according to claim 34 wherein said dopant comprises an indigo dye compound having a chemical structure of formula VI:

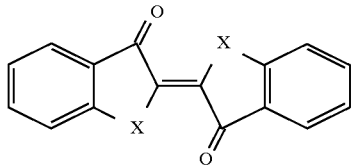

wherein X is NH.

38. A method of fabricating an organic light emitting device for producing electroluminescence comprising:

fabricating a heterostructure for producing electroluminescence, wherein the fabrication process includes the step of depositing a layer comprised of a host material and a dopant, said dopant being comprised of a fullerene compound.

39. The method according to claim 38 wherein said fullerene compound comprises $C_{60}$.

* * * * *

UNITED STATES PATENT AND TRADEMARK OFFICE
CERTIFICATE OF CORRECTION

PATENT NO. : 5,861,219

DATED : January 19, 1999

INVENTOR(S) : Thompson et al.

It is certified that error appears in the above-identified patent and that said Letters Patent is hereby corrected as shown below:

Column 3, line 63, change "5 hydroxy-quinoxaline" to -- 5-hydroxy-quinoxaline --.

Column 11, line 24, change "application" to -- applications --.

Column 18, line 16, change "a" to -- an --.

Column 18, line 32, change "π-electron" to -- ∏-electron --.

Signed and Sealed this

Twenty-ninth Day of February, 2000

Q. TODD DICKINSON

*Attest:*

*Attesting Officer*  *Commissioner of Patents and Trademarks*